United States Patent
Yang et al.

(10) Patent No.: US 9,704,782 B2
(45) Date of Patent: Jul. 11, 2017

(54) THREE-DIMENSIONAL INTEGRATED CIRCUIT AND TSV REPAIRING METHOD THEREOF

(71) Applicant: RESEARCH & BUSINESS FOUNDATION SUNGKYUNKWAN UNIVERSITY, Suwon-si (KR)

(72) Inventors: Joon-Sung Yang, Seongnam-si (KR); Hyunseung Han, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 41 days.

(21) Appl. No.: 14/843,638

(22) Filed: Sep. 2, 2015

(65) Prior Publication Data

US 2016/0071785 A1 Mar. 10, 2016

(30) Foreign Application Priority Data

Sep. 4, 2014 (KR) .................. 10-2014-0117833

(51) Int. Cl.
| | |
|---|---|
| H01L 23/50 | (2006.01) |
| H01L 23/48 | (2006.01) |
| H01L 23/58 | (2006.01) |
| H01L 27/06 | (2006.01) |
| H01L 21/66 | (2006.01) |

(52) U.S. Cl.
CPC ............ *H01L 23/481* (2013.01); *H01L 23/58* (2013.01); *H01L 22/22* (2013.01); *H01L 27/0688* (2013.01); *H01L 2924/0002* (2013.01)

(58) Field of Classification Search
None
See application file for complete search history.

(56) References Cited

U.S. PATENT DOCUMENTS

2010/0127758 A1* 5/2010 Hollis .................. G11C 5/02
327/526
2014/0266418 A1* 9/2014 Huang .................. H01L 23/50
327/565

* cited by examiner

*Primary Examiner* — Robert Bachner
*Assistant Examiner* — Molly Reida
(74) *Attorney, Agent, or Firm* — NSIP Law

(57) ABSTRACT

A three-dimensional (3D) integrated circuit (IC) includes a plurality of through silicon vias (TSVs) configured to provide paths via which digital signals are transmitted or received; at least one redundant TSV configured to provide a path via which a digital signal to be transmitted or received via a failed TSV with a defect among the plurality of TSVs is transmitted or received; a digital-to-analog converter (DAC) configured to convert a digital signal transmitted via the at least one redundant TSV into an analog signal; an analog-to-digital converter (ADC) configured to convert an analog signal received via the at least one redundant TSV into a digital signal; and a multilevel modulator configured to perform multilevel modulation on a digital signal transmitted via the at least one redundant TSV.

10 Claims, 6 Drawing Sheets

[fig 1]
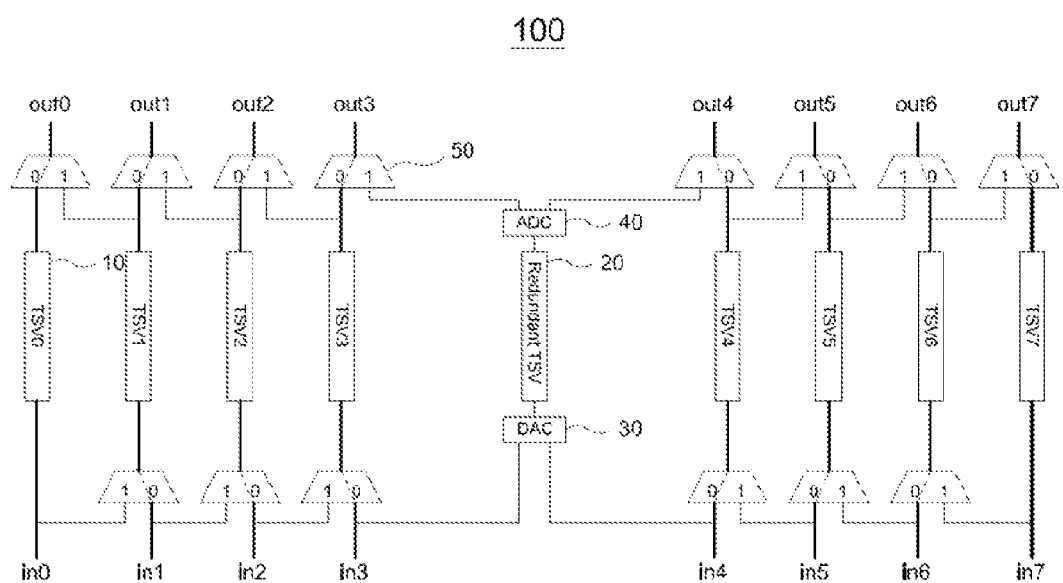

[fig 2]
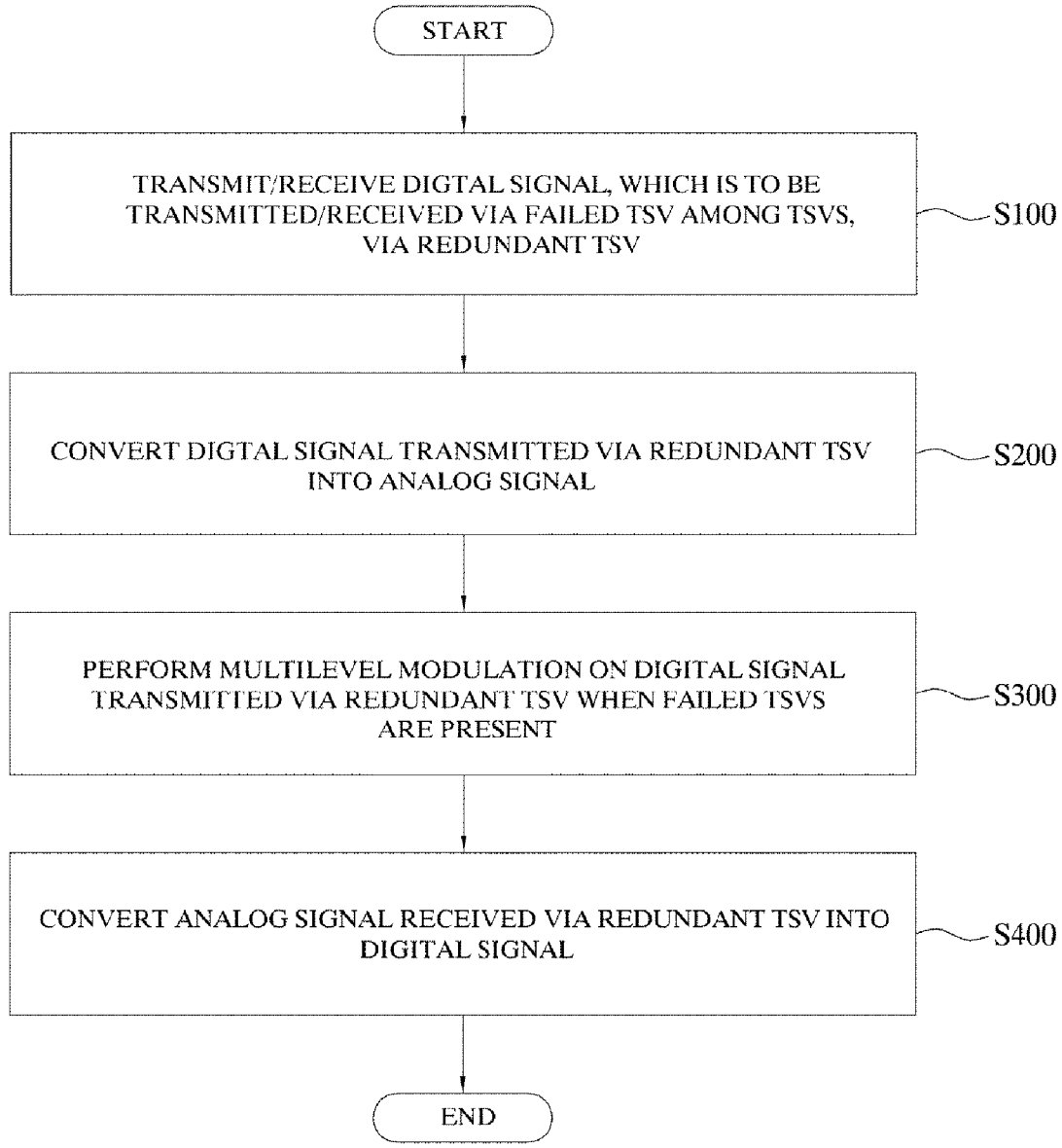

[fig 3]
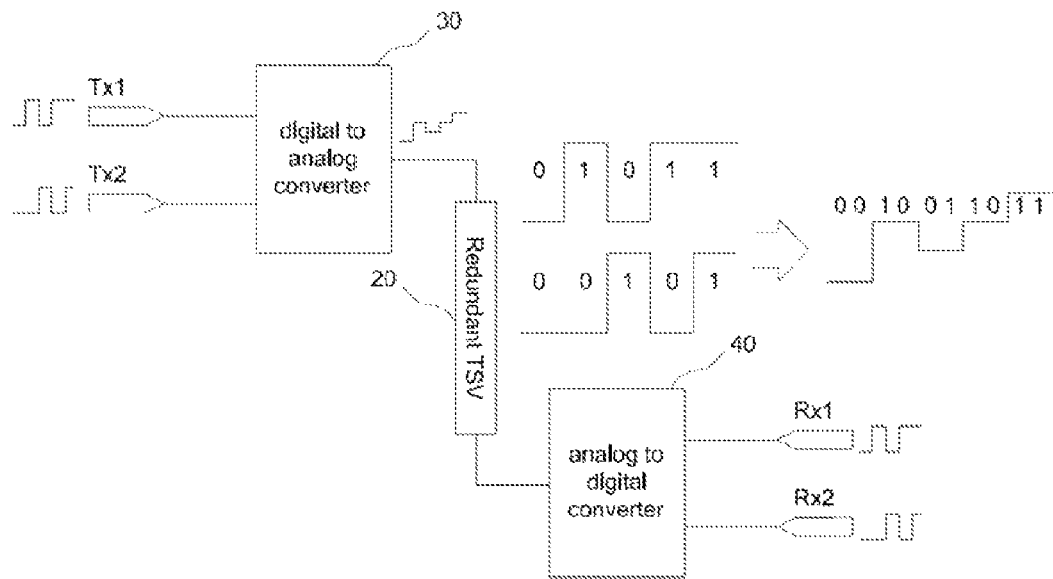
[fig 4]
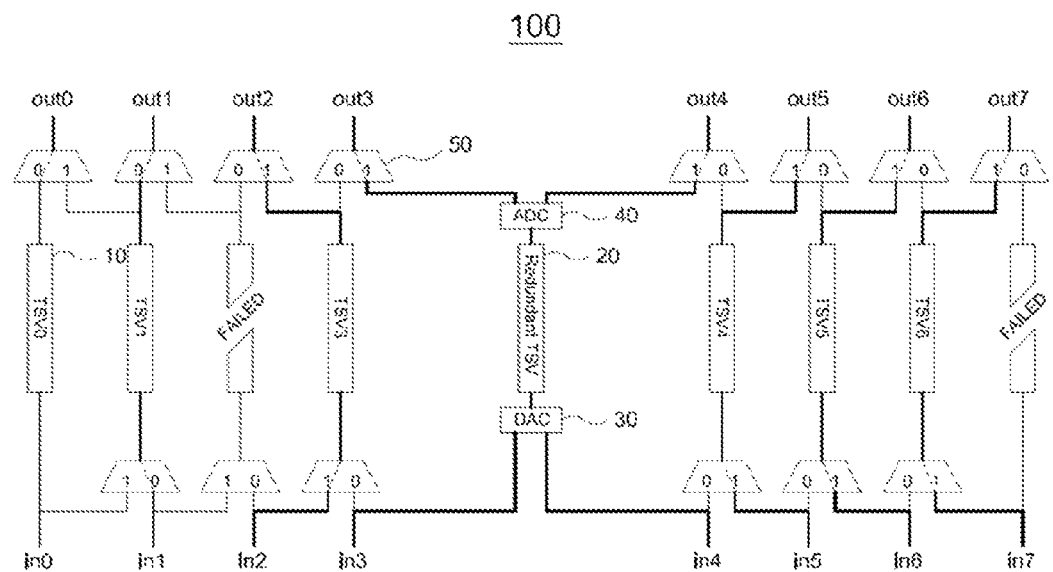

[fig 5a]
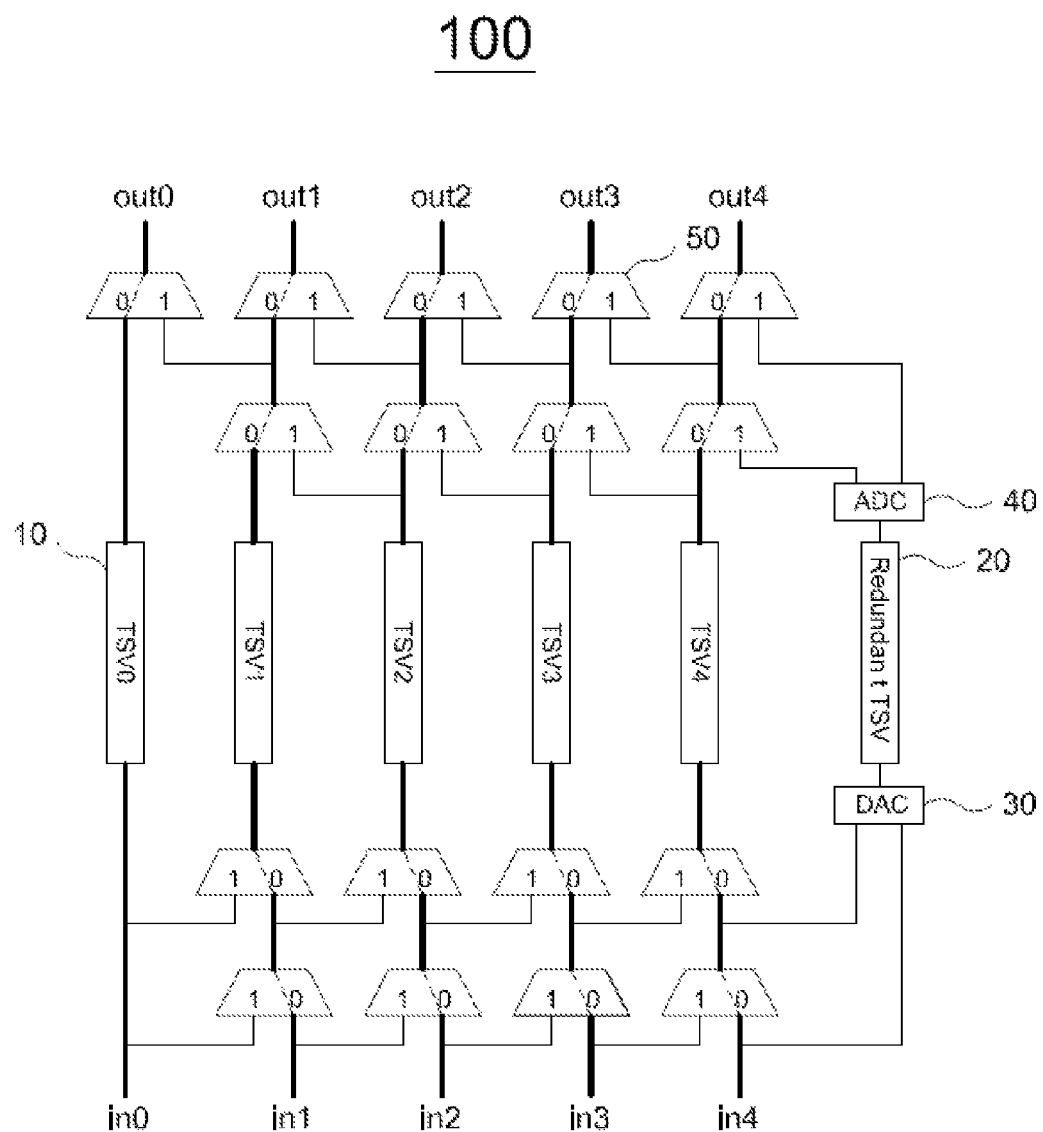

[fig 5b]
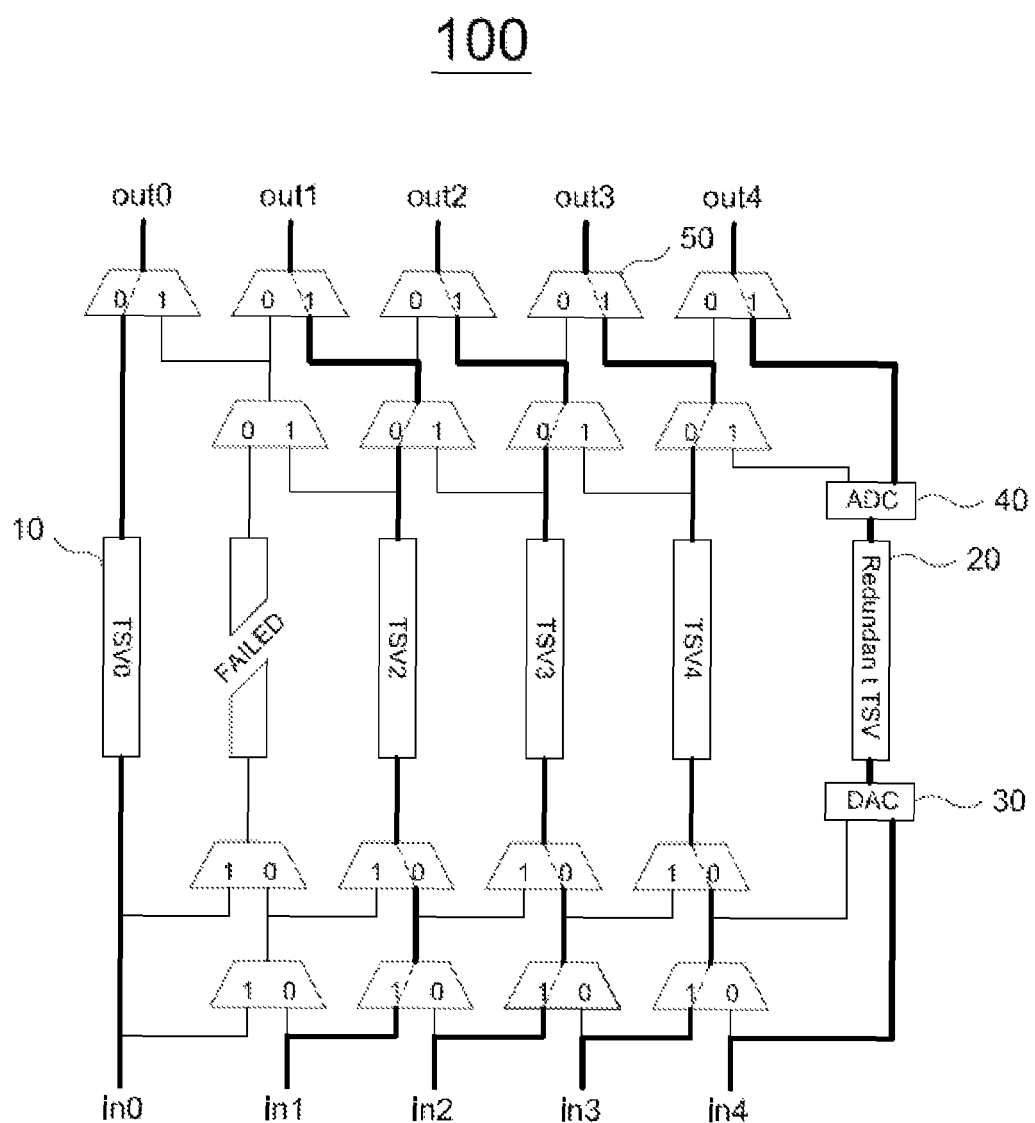

[fig 5c]
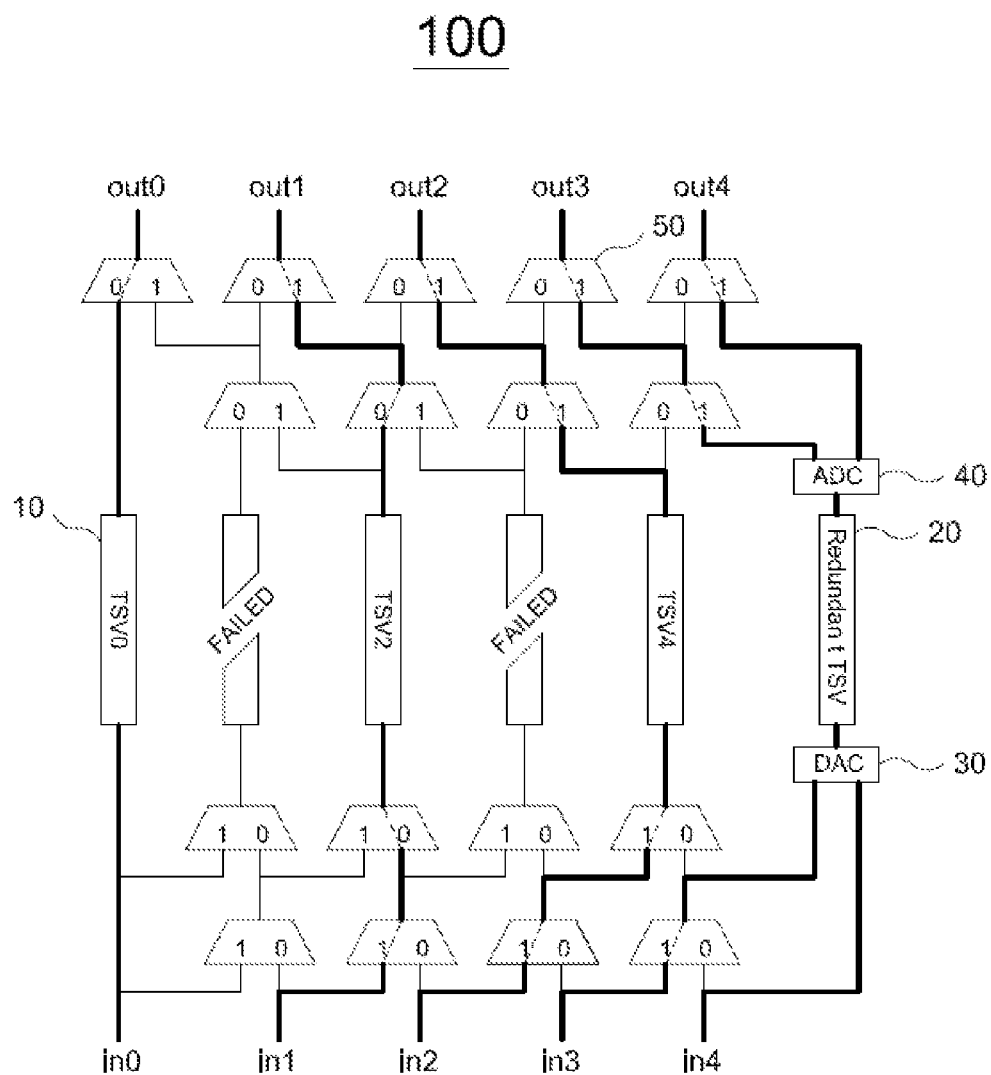

THREE-DIMENSIONAL INTEGRATED CIRCUIT AND TSV REPAIRING METHOD THEREOF

CROSS-REFERENCE TO RELATED APPLICATION

This application claims the benefit under 35 USC 119(a) of Korean Patent Application No. 10-2014-0117833, filed on Sep. 4, 2014, the entire disclosure of which is incorporated herein by reference for all purposes.

BACKGROUND

1. Field of the Invention

The present invention relates to a three-dimensional (3D) integrated circuit (IC), and more particularly, to a 3D IC using a through silicon via (TSV) and a method of repairing TSVs of the 3D IC.

2. Discussion of Related Art

Recently, as electronic products have been developed to have a high capacity and a high density and to be lighter, operating voltages and sizes of electronic devices have been decreased. The existing two-dimensional (2D) mounting methods have problems, for example, that signals are transmitted at low speeds and a packaging area increases due to a large number of input/output (I/O) pads, and are thus not in accord with a current tendency of the industry of electronic products. Thus, research has been actively conducted on three-dimensional (3D) packaging methods of mounting integrated circuits (ICs) by stacking them in a vertical direction. Among the 3D packaging methods, most attention has been paid to a through silicon via (TSV) technique of forming through-holes in a silicon wafer and using the through-holes as electrical paths.

In general, when a TSV has a defect, a redundant TSV is used to repair the TSV with the defect. When a number of redundant TSVs is provided to be in proportional to the number of TSVs that are actually included in a 3D IC, a rate of successfully repairing failed TSVs is high.

However, redundant TSVs are large in size and thus there is a limit to arranging a large number of redundant TSVs in a 3D IC.

When a process of arranging a large number of redundant TSVs in a 3D IC is performed, the process is difficult to be performed and may thus cause a defect to occur in the 3D IC. This is because the process of arranging a large number of redundant TSVs in a 3D IC may cause layers in the vicinity of the redundant TSVs to deform, and redundant TSVs may be influenced by a process of arranging layers in the vicinity of the redundant TSVs.

Also, manufacturing costs are high when a large number of redundant TSVs are arranged to repair failed TSVs.

SUMMARY OF THE INVENTION

The present invention is directed to a three-dimensional (3D) integrated circuit (IC) capable of repairing through silicon vias (TSVs) thereof by controlling a plurality of digital signals, which cannot be transmitted or received due to a plurality of failed TSVs, to be transmitted or received via one redundant TSV.

The present invention is also directed to a method of repairing TSVs of such a 3D IC using the 3D IC.

According to an aspect of the present invention, a three-dimensional (3D) integrated circuit (IC) includes a plurality of through silicon vias (TSVs) configured to provide paths via which digital signals are transmitted or received; at least one redundant TSV configured to provide a path via which a digital signal to be transmitted or received via a failed TSV with a defect among the plurality of TSVs is transmitted or received; a digital-to-analog converter (DAC) configured to convert a digital signal transmitted via the at least one redundant TSV into an analog signal; an analog-to-digital converter (ADC) configured to convert an analog signal received via the at least one redundant TSV into a digital signal; and a multilevel modulator configured to perform multilevel modulation on a digital signal transmitted via the at least one redundant TSV.

According to one aspect of the present invention, the 3D IC may include the DAC, the ADC, and the multilevel modulator to transmit or receive a multilevel signal obtained by synthesizing a plurality of digital signals via one redundant TSV.

According to another aspect of the present invention, multilevel modulation may be performed on all digital signals transmitted or received via the plurality of TSVs and the at least one redundant TSV. In this case, not only a failed TSV may be repaired but also data repairing may be performed by applying error correction coding (ECC) to the multilevel modulated signals.

In one embodiment, the at least one redundant TSV may be arranged between the plurality of TSVs.

In one embodiment, when a plurality of failed TSVs with a defect are present, the multilevel modulator may perform multilevel modulation on a digital signal transmitted via the at least one redundant TSV.

According to one aspect of the present invention, when one failed TSV occurs, the at least one redundant TSV may function as a general binary TSV to transmit or receive a digital signal that cannot be transmitted due to the failed TSV. However, when two or more failed TSVs occur, the at least one redundant TSV may function as a quaternary TSV through the multilevel modulator and be thus capable of transmitting 2-bit signals at the same time. Thus, digital signals that cannot be transmitted or received due to the two or more failed TSVs may be transmitted or received via the at least one TSV.

In one embodiment, the DAC may convert a digital signal transmitted via a redundant TSV selected from among the at least one redundant TSV into an analog signal, the ADC may convert an analog signal received via the selected redundant TSV into a digital signal, and the multilevel modulator may perform multilevel modulation on a digital signal transmitted via the selected redundant TSV.

According to another aspect of the present invention, a method of repairing a through silicon via (TSV) of a three-dimensional (3D) integrated circuit (IC) includes providing at least one redundant TSV as a path via which a digital signal to be transmitted or received via a failed through silicon via (TSV) with a defect among a plurality of TSVs is transmitted or received; converting a digital signal transmitted via the at least one redundant TSV into an analog signal; performing multilevel modulation on a digital signal transmitted via the at least one redundant TSV when a plurality of failed TSVs with a defect are present; and converting an analog signal received via the at least one redundant TSV into a digital signal.

In one embodiment, the at least one redundant TSV may be arranged between the plurality of TSVs.

In one embodiment, the converting of the digital signal transmitted via the at least one redundant TSV into the analog signal may include converting a digital signal transmitted via a redundant TSV selected from among the at least one redundant TSV into an analog signal.

In one embodiment, when a plurality of failed TSVs with a defect are present, the performing of the multilevel modulation on the digital signal transmitted via the at least one redundant TSV may include performing multilevel modulation on a digital signal transmitted via a redundant TSV selected from among the at least one redundant TSV.

In one embodiment, the converting of the analog signal received via the at least one redundant TSV into the digital signal may include converting an analog signal received via a redundant TSV selected from among the at least one redundant TSV into a digital signal.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a schematic diagram illustrating a three-dimensional (3D) integrated circuit (IC) according to an exemplary embodiment of the present invention;

FIG. 2 is a flowchart of a method of repairing through silicon vias (TSVs) of a 3D IC according to an exemplary embodiment of the present invention;

FIG. 3 is a conceptual diagram for explaining multilevel modulation according to an exemplary embodiment of the present invention;

FIG. 4 is a diagram illustrating a method of repairing TSVs of a 3D IC according to an exemplary embodiment of the present invention;

FIG. 5A is a schematic diagram of a 3D IC according to another exemplary embodiment of the present invention;

FIG. 5B is a diagram illustrating a method of repairing one failed TSV occurring in the 3D IC of FIG. 5A; and FIG. 5C is a diagram illustrating a method of repairing two failed TSVs occurring in the 3D IC of FIG. 5A.

DETAILED DESCRIPTION OF EXEMPLARY EMBODIMENTS

The present invention may be embodied in many different forms and accomplished in various embodiments. Thus, exemplary embodiments of the present invention will be illustrated in the drawings and described in detail in the detailed description. However, the present invention is not limited to these exemplary embodiments, and it would be appreciated by those of ordinary skill in the art that changes may be made in these exemplary embodiments without departing from the principles and spirit of the invention, the scope of which is defined in the claims and their equivalents.

Hereinafter, exemplary embodiments of the present invention will be described in detail with reference to the accompanying drawings. The same reference numerals represent the same elements throughout the drawings.

FIG. 1 is a schematic diagram illustrating a three-dimensional (3D) integrated circuit (IC) 100 according to an exemplary embodiment of the present invention.

Referring to FIG. 1, the 3D IC 100 according to an exemplary embodiment of the present invention may include a plurality of through silicon vias (TSVs) TSV0 to TSV7 10, at least one redundant TSV 20, a digital-to-analog converter (DAC) 30, an analog-to-digital converter (ADC) 40, and a multilevel modulator (not shown).

The plurality of TSVs 10 may each provide a path via which a digital signal is transmitted or received. Digital signals that are input via respective input terminals in0 to in7 may be output to output terminals out0 to out7 via the plurality of TSVs TSV0 to TSV7 10, respectively. A multiplexer 50 may be disposed at each of the input terminals in0 to in7 to exchange a signal with an input terminal adjacent to each of the input terminals in0 to in7. Also, a multiplexer 50 may be disposed at each of the output terminals out0 to out7 to exchange a signal with an output terminal adjacent to each of the output terminals out0 to out7.

The at least one redundant TSV 20 may provide a path via which a digital signal, which cannot be transmitted or received due to a failed TSV with a defect among the plurality of TSVs TSV0 to TSV7 10, is transmitted or received. The at least one redundant TSV 20 may allow a digital signal, which cannot be transmitted/received due to the failed TSV, to be transmitted or received via a detour. Using the at least one redundant TSV 20, the failed TSV may be repaired.

The DAC 30 may convert a digital signal transmitted via the at least one redundant TSV 20 into an analog signal.

The ADC 40 may convert an analog signal received via the at least one redundant TSV 20 into a digital signal.

The multilevel modulator may perform multilevel modulation on a digital signal transmitted via the at least one redundant TSV 20.

When a defect occurs in one of the plurality of TSVs TSV0 to TSV7 10, the multilevel modulator does not perform multilevel modulation and the at least one redundant TSV 20 allows a digital signal to be transmitted or received therethrough according to a method similar to a method of the related art.

However, when a defect occurs in two or more TSVs among the plurality of TSVs TSV0 to TSV7 10, the multilevel modulator may perform multilevel modulation on digital signals transmitted via the at least one redundant TSV 20, so that digital signals that cannot be transmitted or received due to the failed TSVs may be transmitted or received via one redundant TSV 20.

In general, one redundant TSV provides only one path via which a digital signal that cannot be transmitted or received due to one failed TSV is transmitted or received via a detour. However, the 3D IC 100 according to an exemplary embodiment of the present invention includes the DAC 30, the ADC 40 and the multilevel modulator, and may be thus capable of performing multilevel modulation on a digital signal that can be transmitted or received via one redundant TSV 20 to transmit and receive a plurality of digital signals, as will be described in detail below.

For example, the at least one redundant TSV 20 may be disposed between the plurality of TSVs TSV0 to TSV7 10, so that paths via which digital signals are delivered may be shortened to increase signal processing speeds. The location of the redundant TSV 20 to be disposed between the TSVs TSV0 to TSV7 10 may be appropriately changed according to a usage environment.

Also, the DAC 30 may convert a digital signal transmitted via a redundant TSV 20 selected from among the at least one redundant TSV 20 into an analog signal. The ADC 40 may convert an analog signal received from the selected redundant TSV 20 into a digital signal. The multilevel modulator may perform multilevel modulation on a digital signal transmitted via the selected redundant TSV 20, so that multilevel modulation may not be performed on all digital signals transmitted or received via the at least one redundant TSV 20 but may be performed in consideration of efficiency between costs and signal processing speeds by appropriately arranging redundant TSVs 20 for performing multilevel modulation on digital signals and the remaining redundant TSVs 20 according to a usage environment. In order to perform multilevel modulation on a digital signal transmitted or received via the selected redundant TSV 20, each of at least one selected redundant TSV 20 may include the DAC 30 and the ADC 40 as illustrated in FIG. 1 and analog/digital conversion may be also performed using one DAC 30 and one ADC 40. As described above, since multilevel modulation may be performed on only a digital signal transmitted or received via the selected redundant TSV 20, a user may design and manufacture a 3D IC in consideration of the efficiency between costs and signal processing speeds.

FIG. 2 is a flowchart of a method of repairing TSVs of a 3D IC according to an exemplary embodiment of the present invention. FIG. 3 is a conceptual diagram for explaining multilevel modulation according to an exemplary embodiment of the present invention.

Referring to FIG. 2, a method of repairing TSVs of a 3D IC according to an exemplary embodiment of the present invention may include providing at least one redundant TSV as a path via which a digital signal to be transmitted/received via a failed TSV among a plurality of TSVs, is transmitted or received (operation S100), converting a digital signal transmitted via the at least one redundant TSV into an analog signal (operation S200), performing multilevel modulation on a digital signal transmitted via the at least one redundant TSV when a plurality of failed TSVs are present (operation S300), and converting an analog signal received via the at least one redundant TSV into a digital signal (operation S400).

In order to repair TSVs of a 3D IC, at least one redundant TSV is provided as a path via which a digital signal to be transmitted/received via a failed TSV among a plurality of TSVs is transmitted or received (operation S100).

For example, the at least one redundant TSV may be disposed between the plurality of TSVs.

Next, a digital signal transmitted via the at least one redundant TSV is converted into an analog signal (operation S200). For example, a digital signal transmitted via a redundant TSV selected from among the at least one redundant TSV may be converted into an analog signal, so that multilevel modulation may be performed on only a digital signal transmitted or received via a redundant TSV for performing multilevel modulation among the at least one redundant TSV.

Next, when a plurality of failed TSVs are present among the plurality of TSVs, multilevel modulation is performed on a digital signal transmitted via the at least one redundant TSV (operation S300). For example, multilevel modulation may be performed on a digital signal transmitted via the redundant TSV selected from among the at least one redundant TSV, so that multilevel modulation may be performed on only a digital signal transmitted or received via a redundant TSV for performing multilevel modulation among the at least one redundant TSV.

Next, an analog signal received via the at least one redundant TSV is converted into a digital signal (operation S400). For example, an analog signal received via a redundant TSV selected from among the at least one redundant TSV may be converted into a digital signal, so that multi-level modulation may be performed on only a digital signal transmitted or received via a redundant TSV for performing multilevel modulation among the at least one redundant TSV.

Multilevel modulation will be described with reference to FIG. 3 below. When two failed TSVs occur, signals that cannot be transmitted due to the two failed TSVs may be input to transmitters Tx1 and Tx2 of the DAC, respectively.

In this case, the signals may be synthesized into one multilevel signal via the multilevel modulator and be then input to the ADC via one redundant TSV.

The input multilevel signal may be converted and output through receivers Rx1 and Rx2 of the ADC, similar to the signals input via the transmitters Tx1 and Tx2. Through the above process, two failed TSVs may be repaired using even one redundant TSV. Although a case in which two failed TSVs occur has been described above, when more than two failed TSVs occur, the more than two failed TSVs may be repaired by increasing the number of multiple levels of a multilevel signal to be obtained by synthesizing signals through the multilevel modulator.

FIG. 5A is a schematic diagram of a 3D IC according to another exemplary embodiment of the present invention. FIG. 5B is a diagram illustrating a method of repairing one failed TSV occurring in the 3D IC of FIG. 5A. FIG. 5C is a diagram illustrating a method of repairing two failed TSVs occurring in the 3D IC of FIG. 5A.

Referring to FIGS. 5A to 5C, each of input terminals in0 to in4 may have a structure in which two multiplexers MUX are arranged to exchange a signal with an adjacent input terminal. Also, each of output terminals out0 to out4 may have a structure in which two multiplexers MUX are arranged to exchange a signal with an adjacent output terminal.

Referring to FIG. 5A, when a defect does not occur in the TSVs TSV0 to TSV4 10, signals of the input terminals in0 to in4 may be transmitted to or received from the output terminals out0 to out4 via the TSVs TSV0 to TSV4 10, respectively.

Referring to FIG. 5B, when a defect occurs in the TSV TSV1 10, a signal that cannot be transmitted or received due to the TSV TSV1 10 may be transmitted or received via the TSV TSV2 10 adjacent to the TSV TSV1 10, and a signal to be transmitted or received via the TSV TSV2 10 may be transmitted or received via a detour, e.g., the TSV TSV3 10 adjacent to the TSV TSV2 10. By transmitting or receiving a signal via a detour as described above, a signal to be transmitted or received via the adjacent TSV TSV3 10 may be transmitted or received via a redundant TSV 20. As illustrated in FIG. 5B, when one failed TSV occurs, the redundant TSV 20 functions as a general binary TSV to transmit or receive a signal that cannot be transmitted or received due to the failed TSV.

Referring to FIG. 5C, when a defect occurs in the two TSVs TSV1 and TSV3 10, signals to be transmitted to or received from the two input terminals in3 and in4 may be transmitted to or received from the two output terminals out3 and out4 via the redundant TSV 20. To this end, multilevel modulation may be performed on the two signals transmitted or received via the redundant TSV 20, and then the two signals may be transmitted or received between the input and output terminals. As described above, in a method of repairing TSVs of a 3D IC according to an exemplary embodiment, signals that cannot be transmitted or received due to a plurality of failed TSVs may be transmitted or received via one redundant TSV, thereby saving an area for additionally arranging redundant TSVs.

As described above, according to an embodiment of the present invention, digital signals that cannot be transmitted or received due to a plurality of failed TSVs may be transmitted or received via one redundant TSV. Accordingly, TSVs may be repaired with a small number of redundant TSVs.

Also, since additional redundant TSVs do not need to be formed in a 3D IC so as to repair TSVs, it is possible to prevent the occurrence of defects that may occur in the 3D IC when additional redundant TSVs are formed.

Also, since multilevel modulation may be performed on only a redundant TSV selected from among redundant TSVs, the stability of a 3D IC may be maintained and the 3D IC may be designed in consideration of costs and signal processing speeds.

According to the present invention, a plurality of failed TSVs may be repaired using one redundant TSV, and thus a rate of successfully repairing the plurality of failed TSVs may be increased.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A three-dimensional (3D) integrated circuit (IC) comprising:
   a plurality of through silicon vias (TSVs) configured to provide paths via which digital signals are transmitted or received;
   at least one redundant TSV configured (i) to provide a path via which a digital signal to be transmitted or received via a failed TSV with a defect among the plurality of TSVs is transmitted or received and (ii) to provide no path when none of the plurality of TSVs are failed;
   a digital-to-analog converter (DAC) configured to convert a digital signal transmitted via the at least one redundant TSV into an analog signal;
   an analog-to-digital converter (ADC) configured to convert an analog signal received via the at least one redundant TSV into a digital signal; and
   a multilevel modulator configured to perform multilevel modulation on a digital signal transmitted via the at least one redundant TSV.

2. The 3D IC of claim 1, wherein the at least one redundant TSV is arranged between the plurality of TSVs.

3. The 3D IC of claim 1, wherein, when a plurality of failed TSVs with a defect are present, the multilevel modulator performs multilevel modulation on a digital signal transmitted via the at least one redundant TSV.

4. The 3D IC of claim 1, wherein the DAC converts a digital signal transmitted via a redundant TSV selected from among the at least one redundant TSV into an analog signal, the ADC converts an analog signal received via the selected the redundant TSV into a digital signal, and the multilevel modulator performs multilevel modulation on a digital signal transmitted via the selected the redundant TSV.

5. A method of repairing a through silicon via (TSV) of a three-dimensional (3D) integrated circuit (IC), the method comprising:
   providing at least one redundant TSV (i) as a path via which a digital signal to be transmitted or received via a failed through silicon via (TSV) with a defect among a plurality of TSVs is transmitted or received and (ii) as no path when none of the plurality of TSVs are failed;
   converting a digital signal transmitted via the at least one redundant TSV into an analog signal;
   performing multilevel modulation on a digital signal transmitted via the at least one redundant TSV when a plurality of failed TSVs with a defect are present; and
   converting an analog signal received via the at least one redundant TSV into a digital signal.

6. The method of claim 5, wherein the at least one redundant TSV is arranged between the plurality of TSVs.

7. The method of claim 5, wherein the converting of the digital signal transmitted via the at least one redundant TSV into the analog signal comprises converting a digital signal transmitted via a redundant TSV selected from among the at least one redundant TSV into an analog signal.

8. The method of claim 5, wherein, when a plurality of failed TSVs with a defect are present, the performing of the multilevel modulation on the digital signal transmitted via the at least one redundant TSV comprises performing multilevel modulation on a digital signal transmitted via a redundant TSV selected from among the at least one redundant TSV.

9. The method of claim 5, wherein the converting of the analog signal received via the at least one redundant TSV into the digital signal comprises converting an analog signal received via a redundant TSV selected from among the at least one redundant TSV into a digital signal.

10. A three-dimensional (3D) integrated circuit (IC) comprising:
    a plurality of through silicon vias (TSVs) each configured to provide a path for transmitting or receiving a digital signal; and
    a redundant TSV configured to
    (i) not function as a TSV when none of the plurality of TSVs are failed,
    (ii) function as a general binary TSV when only one of the plurality of TSVs is failed, and
    (iii) function as a quaternary TSV through a multilevel modulator when two or more of the plurality of TSVs are failed.

* * * * *